(12) United States Patent
Polzer et al.

(10) Patent No.: US 8,829,899 B2
(45) Date of Patent: Sep. 9, 2014

(54) PNEUMATIC VIBRATION DAMPING APPARATUS

(75) Inventors: Benjamin David Polzer, Sudbury (CA); Gordon Fox West, Toronto (CA); Peter White Walker, Mississauga (CA)

(73) Assignee: Vale S.A., Rio de Janeiro (BR)

( * ) Notice: Subject to any disclaimer, the term of this patent is extended or adjusted under 35 U.S.C. 154(b) by 68 days.

(21) Appl. No.: 13/559,088

(22) Filed: Jul. 26, 2012

(65) Prior Publication Data
US 2013/0200248 A1 Aug. 8, 2013

Related U.S. Application Data

(63) Continuation-in-part of application No. 12/688,565, filed on Jan. 15, 2010, now Pat. No. 8,456,159.

(60) Provisional application No. 61/511,809, filed on Jul. 26, 2011.

(51) Int. Cl.
*G01R 33/02* (2006.01)

(52) U.S. Cl.
USPC ........... 324/246; 324/326; 324/331; 324/332; 324/334; 324/336; 73/152.15; 73/152.47; 73/152.58; 73/493; 73/496; 343/709; 33/344

(58) Field of Classification Search
USPC ......... 324/246, 326, 331, 332, 334–336, 350; 73/152.15–152.16, 152.47, 152.58, 73/430, 431, 493, 496; 343/709; 33/344
See application file for complete search history.

(56) References Cited

U.S. PATENT DOCUMENTS

| | | | | |
|---|---|---|---|---|
| 3,690,607 A | * | 9/1972 | Mard | 248/550 |
| 5,354,158 A | * | 10/1994 | Sheldon et al. | 409/201 |
| 5,457,980 A | * | 10/1995 | Kirii et al. | 72/351 |
| 5,538,373 A | * | 7/1996 | Kirkham | 409/131 |
| 6,369,573 B1 | * | 4/2002 | Turner et al. | 324/331 |
| 7,784,773 B1 | * | 8/2010 | Sanetick et al. | 267/205 |
| 7,950,633 B2 | * | 5/2011 | Hiley et al. | 267/136 |
| 8,289,023 B2 | * | 10/2012 | Kuzmin et al. | 324/345 |
| 2003/0169045 A1 | * | 9/2003 | Whitton | 324/330 |
| 2008/0118382 A1 | * | 5/2008 | Ramsey et al. | 417/557 |
| 2009/0206204 A1 | * | 8/2009 | Rosen | 244/158.5 |
| 2013/0043037 A1 | * | 2/2013 | Ramsey et al. | 166/369 |

* cited by examiner

*Primary Examiner* — Tung X Nguyen
*Assistant Examiner* — Thang Le
(74) *Attorney, Agent, or Firm* — Arent Fox LLP

(57) ABSTRACT

A pneumatic vibration isolating suspension is disclosed for supporting a payload on a moving carrier while suppressing the transmission of vibrations in the 1 to 50 Hz band between the carrier and the payload. The disclosed invention can be deployed in the air in a towed carrier or sonde, and operated from aircraft power, making it a suitable platform for airborne geophysical instrumentation. It also has particular application to airborne electromagnetic surveying operating in the same frequency band because the sensor vibrations that result in noise created by the modulation of the sensor coupling with the earth's magnetic field are suppressed. Furthermore, the invention can be constructed from resistive composite materials and non-magnetic metals, so it can be operated without producing significant modification to the ambient electromagnetic field being measured.

46 Claims, 10 Drawing Sheets

PNEUMATIC VIBRATION DAMPING APPARATUS

RELATED APPLICATIONS

This application claims priority to U.S. Provisional Application No. 61/511,809 filed on Jul. 26, 2011 by Polzer et al. entitled "Pneumatic Vibration Damping Apparatus," and is a continuation-in-part of U.S. patent application Ser. No. 12/688,565 filed on Jan. 15, 2010 by Polzer et al entitled "Stabilization System for Sensors on Moving Platforms," both assigned to the assignee hereof and both hereby incorporated by reference herein.

BACKGROUND OF THE INVENTION

1. Field of the Invention

Aspects of this invention relate generally to suspension systems and to methods for reducing the transmission of motion in a certain bandwidth from a carrier to a payload, or the reduction in vibration in a certain bandwidth of a fixed carrier by its vibrating payload. More particularly, aspects of the current invention can be installed on a moving carrier that is subject to variations in acceleration as a result of its motion, where the variations experienced by the payload in a selected frequency band are damped.

2. Description of the Related Art

The mitigation of unwanted vibrations on motion-sensitive apparatus is a subject on which an abundance of information exists. In many cases, the purpose of such devices is to isolate a sensor or sensing apparatus from motions that would add noise or distort a measurement. Such motion isolation devices, which purpose is to damp the transmission of vibrations between a payload and a supporting carrier, typically use vibration absorbing materials, mechanical isolation involving springs and dampers, or pneumatic components and magnetic levitation in which the Lorentz force is employed. Many such systems employ a combination of active and passive feedback to adjust the effective mass, damping and stiffness of the system to optimize the isolation in order to suit the type of motion of the carrier and the mass of the payload being transported. A considerable part of the related art considers the isolation of sensors from the vibrations in the carriers the sensors are mounted on.

To understand the problem being solved by aspects of the current invention, an example of a motion isolation in one dimension is given in FIG. 1. The purpose of a motion isolating mechanism is to minimize the displacement $x_m$ of a mass m, acted on by force, $f_m$ transferred through the motion isolation apparatus from a force imparted by a carrier platform, $f_p$, that is located at $x_p$. Following Whorton et al (Damping mechanisms for microgravity vibration isolation, MSFC Centre Director's Discretionary Fund Final Report, Project No. 94-07, NASA/TM-1998-206953), if this force is transferred to the mass through a spring with constant, k, and damping, d, then:

$$md^2x_m/dt^2 + dd(x_m-x_p)/dt + k(x_m-x_p) = f_m + f_p \quad (1)$$

which results in the following condition for force-free motion when the Laplace Transform is taken:

$$ms^2x_m(s) + ds(x_m(s)-x_p(s)) + k(x_m(s)-x_p(s)) = 0 \quad (2)$$

and which generates the following transfer function:

$$x_m(s)/x_p(s) = (2\zeta\omega s + \omega^2)/(s^2 + 2\zeta\omega s + \omega^2) \quad (3)$$

where the natural frequency of the system, $\omega$, is defined by $\omega^2 = k/m$ and the damping ratio $\zeta$, is defined as $\zeta^2 = d^2/4$ km.

The damping ratio is the ratio of the actual damping, d, to the damping required to reach critical damping, given by $d^2=4$ km. The damping ratio must be less than 1 if the system is to oscillate.

This system acts as a low-pass filter that transfers carrier displacements below the damped natural frequency, $\omega_d$, where $\omega^2_d = \omega^2 (1-\zeta^2)$. An example of such a device is used in the Gedex airborne gravity gradiometer, where three passive translational isolation stages use springs and dampers reduce the accelerations experienced by the gradiometer at frequencies above 1 Hz.

Certain other approaches to vibration isolation increase the mass, m, so as to reduce the damped natural frequency. Such approaches are used in structural design to control the sway of buildings, but are not applicable for use in airborne vibration control applications as instruments and carriers with large masses become prohibitively expensive to operate. Others, such as in U.S. Pat. No. 5,549,270, lower the effective spring constant k by mechanical means but have limited travel. Yet other methods use acceleration feedback on the carrier force to modify the effective mass, velocity feedback to modify the damping, and displacement feedback to modify the effective spring constant. In so doing, the damping and damped natural frequency can be modified dynamically as required. Examples of such approaches are U.S. Pat. No. 6,196,514 and US Patent Application Publication No. 2002/0092350 in which a force feedback transducer is employed.

In the case of a geophysical measurement, mechanical vibrations can be introduced in mobile carriers through a number of pathways. For example, vibrations can be caused by unbalanced moving mechanical components, uneven friction as mechanical joints work against each other, buffeting of the carrier by wind or wave action in the case of an aircraft or ship, the motion of the carrier across uneven ground in the case of a land vehicle, the strumming of cables in the wind or water, or pendular motion in cases where a carrier is towed from a moving vehicle. Because the forces associated with carrier vibrations act on the sensors through their mounting points, these forces can result in torques being applied to the sensor. These torques, in turn, can cause the sensor to rotate relative to the mobile carrier upon which it is mounted. Such rotations are in superposition to the rotations imparted to the sensor directly by the rotation of the mobile carrier itself. In general, carrier vibrations result in translations and rotations of the sensor relative to the carrier on which it is mounted.

Vibrations can introduce noise into sensor data in several ways. For example, mechanical vibrations can introduce small geometrical changes in the shape of the sensor, altering its sensitivity to the quantity it is detecting. An example of such an effect would be the motion of one capacitive electrode relative to another causing a change in capacitance, the self motion within a coil changing its inductance, the relative motion of two coils, changing their mutual inductance and the motion of a lens relative to its focal plane, causing blurring of the detected image. Noise can also be introduced in a measurement by small motions in nearby objects, which if they are conductive could induce the flow of eddy currents and so add noise to an electromagnetic measurement, or to a measurement of a quality dependent on an electromagnetic characteristic for its resolution. Vibrations can also introduce small displacements in the positions of nearby objects, which could change the background field detected by the sensor, particularly if the object were electrically conductive, magnetically permeable or permanently magnetized in the case of an electromagnetic measurement, or which if sufficiently massive, would add noise to a gravity measurement.

Noise can also be introduced into the measurement of a vector component if the sensor rotates in a large background static field. Such considerations apply in particular to electric, magnetic, electromagnetic and gravimetric measurements where the static field of the Earth is much larger than the variations in field that are typically mapped. In order to reduce motion induced noise in the sensors caused by their rotations in the larger background field of the Earth, the sensors are often mounted on a sensor platform ("SP") which is mechanically isolated from the mobile carrier with which it is transported. This isolation has two important components, a rotational isolation so that rotations of the vehicle are decoupled from the SP, and isolation from translational acceleration, noting that translational accelerations can also couple into rotational or angular accelerations if the forces are not applied through the centre of mass of the SP.

As discussed previously, various motion-isolation techniques have been applied to numerous combinations of carrier and payload. However, in the field of airborne electromagnetic measurement, suspension techniques have largely been limited to the use of vibration absorbing materials, including systems of bungee cords, to provide the spring constant and the damping elements such as U.S. Patent Application Publication No. 2003/0094952, U.S. Patent Application Publication No. 2003/0169045, and Canadian Patent No. 2722457. Techniques such as the ones used in the cited patents have been effective in suppressing higher frequency (25 Hz and above) vibrational noise, which is often referred to in the airborne electromagnetic survey industry as microphonic noise. However at frequencies below 25 Hz, vibration-induced noise usually overwhelms the signal being measured, providing an effective limit below which it is extremely difficult to acquire meaningful electromagnetic data at low signal levels. However, the band between 1 and 25 Hz is also one where a number of important phenomena, such as induced polarization, can be more easily observed if data of sufficiently low noise could be collected. Induced polarization measurements are an important tool for diagnosing the presence of certain mineral deposits and other geological phenomena. Limiting the acquisition band to 25 Hz and above also renders many highly conductive ores invisible to some airborne electromagnetic systems, and can limit the depth of exploration of electromagnetic systems, particularly over areas where the ground is highly conductive.

Turner et al (U.S. Pat. No. 6,369,573) recognizes the importance of reducing the rotation of a towed airborne vehicle for making SQUID magnetometer measurements in the Earth's field. Turner uses a combination of nested spheres, liquid, baffles, springs and dampers and claims to reduce the rotational motion of a payload in the data acquisition band, greater than 20 Hz. Henderson et al. (U.S. Pat. No. 5,117,695) uses coaxial cylinders with the inner cavity filled with a damping fluid, together with springs and dampers to protect single axis devices, such as an accelerometer, and is intended for space vehicle applications.

In the field of airborne geophysics, pneumatic motion isolation has principally been used in gravity and gravity gradiometry, mainly through the use of air bearings for example. A high-precision two-frame inertial platform and a gravimeter sensor for airborne application in which an air bearing gyro was modified and used to stabilize the system. However, airborne geophysical data can generally not be acquired with a pneumatically based motion isolation system that can be deployed in an airborne device.

Measurement of low-noise, low-frequency electromagnetic data on a mobile carrier has challenges not presented by other measurements. In airborne operations, these can require distancing the electromagnetic sensors from the aircraft to limit mechanical or electrical noise which can be from the motion of the airframe through the Earth's magnetic field, on-board power, induction within the airframe, or by electromagnetic transmissions and aircraft propulsion systems. A common solution to the aircraft noise problem is to mount the receiving apparatus in an enclosed carrier towed below a helicopter or fixed wing aircraft at some distance typically ranging from 30 to 80 meters. As a result, any motion isolating apparatus mounted in the carrier faces limitations on weight and size that can be safely deployed and reliably controlled. In the case of an electromagnetic survey, the motion controlling apparatus must also be electromagnetically quiet, placing additional restriction on how a vibration isolation apparatus can be built and operated. Such restrictions have so far prevented successful routine acquisition of low amplitude electromagnetic data in the 1-25 Hz frequency band.

In the current state-of-the-art, noise is often reduced in a sensor measurement by stacking or averaging when a repetitive signal is being processed. Stacking or averaging in effect blends the sensor output acquired over a specific time interval. If the sensor is mounted on a mobile carrier, it may be displaced as the carrier to which it is attached is moved. If the amount of displacement is significant, the fields measured by sensor may vary in accordance with the proximity of the sensor to the phenomena causing the field. The result is that a single stack may blend fields scattered from a plurality of causes in different proportions, thereby limiting the spatial resolution, or the ability to resolve the various causes from each other. An example of such an effect is encountered in geophysical survey systems that are deployed on mobile airborne survey carriers. In such cases, measurements are typically made along parallel traverse lines at a speed of approximately 30 meters/second in the case of a helicopter or 90 meters/second in the case of a fixed-wing aircraft. For a signal acquired at 1 Hz, the sensor may typically have traversed 30 meters (helicopter) or 90 meters (fixed wing) over one cycle. If a stack were to include 10 cycles, the extent of the travel incorporated in a single stack would be 300 meters in the case of a helicopter system and 900 meters in the case of a fixed wing system. In such cases, it may be difficult to resolve a targeted cause, such as an ore deposit or structure associated with an ore deposit, with dimensions that are much smaller than the distance spanned by a single stack. Additional difficulties may include variations in topography, overburden, and water saturation, the fields from which are also blended in the stack, further obscuring the signal of the targeted cause within the stack.

The current state of the art in the airborne EM method is exemplified by such systems as U.S. Patent Application No. 2008/0246484A1, U.S. Pat. No. 7,157,914, or U.S. Patent Application No. 2003/0094952. The noise generated by carrier motion in such systems increases significantly below the 25 Hz threshold, rendering high-precision, low noise electromagnetic measurements below the 25 Hz barrier impractical. As the electrical properties of many objects of interest within the ground are detectable only in the frequency band spanning 1 Hz to 25 Hz, they are undetectable with moving electromagnetic survey systems employing state-of-the-art vibration damping means.

SUMMARY OF THE INVENTION

Aspects of the current invention are related to the isolation of laboratory equipment, such as electron microscopes or gravity wave detectors, from vibrations that may occur in buildings or other static structures in which they are located. Other aspects are related to the isolation of micro-gravity experiments from vibrations and disturbances caused by atmospheric friction, mechanical components and the motion of astronauts on the international space station. Other aspects are related to the isolation of space based telescopic and interferometric instrumentation from the vibrations introduced by sources such as reaction wheels and atmospheric drag.

Aspects of the current invention include a tunable pneumatic isolation system which isolates a payload, which could be a sensor platform, from the motion of the carrier. A major advantage of the disclosed pneumatic system is that it can be tuned to damp motions with periods down to 1 Hz and can be installed in a confined volume, such as on a carrier towable from a helicopter. As such, the invention has an advantage over elastomer (spring and damper) based methods currently employed in airborne electromagnetic measurement, for which the lower limit of motion damping lies at approximately 25 Hz.

The result may permit a payload to follow a trajectory that is largely independent of the trajectory of the carrier in that frequency band. The invention is capable of being tuned both to accommodate different weight loads and thus provide tunable vibration isolation in different frequency bands. Since the invention can be constructed from highly resistive components, non-magnetic metals and low-noise actuators, it provides little distortion to the ambient electromagnetic field, a characteristic of importance in airborne electromagnetic surveys.

Additional advantages and novel features of these aspects of the invention may be set forth in part in the description that follows, and in part may become more apparent to those skilled in the art upon examination of the following or upon learning by practice of the invention.

BRIEF DESCRIPTION OF THE DRAWINGS

Various exemplary aspects of the systems and methods may be described in detail, with reference to the following figures, wherein.

DETAILED DESCRIPTION OF PREFERRED ASPECTS

Figure 1:
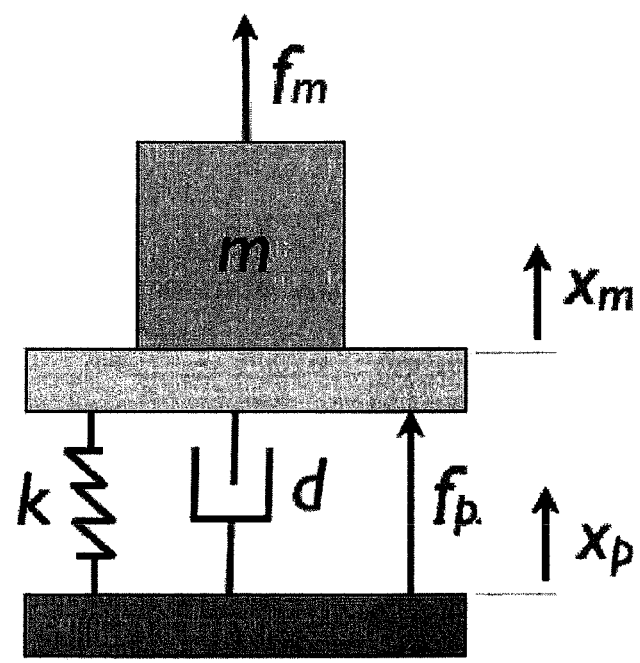
FIG. 1 is an illustration of a damping mechanism.

According to various aspects of the current invention, a sensor platform (SP) or sensor carrier may be mounted on an assembly or "basket," in order to isolate the motion of the carrier from the basket. Aspects of the invention may be affixed to a carrier with a frame, which in most cases may be rigid, but which can also contain internal damping means. In the case where the carrier is towed from a vehicle, the frame is called a "tow frame", but it is understood that the terminology "frame" and "tow frame" may be used interchangeably, and both describe the means for attaching the invention to the carrier. For mobile applications, the carrier may be the vehicle in which aspects of the invention are transported. In the case of stationary applications, the carrier may be the static structure in which aspects of the current invention are housed.

Aspects of the present invention use pneumatic struts to support the basket from the frame. The upper end of each strut may be attached to the frame, with the frame being rigidly fixed to the carrier. The lower end of the struts may support a basket, on which the payload is mounted. In various aspects, the basket may be located beneath the frame. However, those skilled in the art may realize that the basket can also be supported above the frame by the struts, or the basket can be mounted within the frame, with the struts supporting the weight of the basket from above and below.

A plurality of pneumatic struts may bear the weight of the payload, which is the device or instrument being motion-isolated, and provide the necessary damping and spring forces to isolate the motion of the payload from the motion of the carrier above a selected cutoff frequency. Sufficient damping is provided to mitigate deleterious behaviour near the system resonance. Each strut may consist of a cylinder that houses a pneumatic piston. The piston may have a head that divides the cylinder into an upper and a lower chamber, and a shaft that extends through the lower chamber, exiting the housing through a sealed orifice at the bottom of the housing. Low friction seals between the piston head and the cylinder wall prevent air in the upper and lower chambers from mixing. The piston shaft extends past the cylinder housing and attaches to a basket with a ball joint. The top of the strut is attached to the frame, also with a ball joint, mounted on top of the cylinder housing.

According to various aspects, the piston can move parallel to the axis of the cylinder and rotate about its axial direction, allowing for frame displacements relative to the basket. Those skilled in the art may understand that "upper" and "lower" are descriptive terms and do not limit the scope of the invention to a particular orientation, and that the amplitudes of the displacements that are permitted by the invention are limited by the displacement of pistons within the cylinders.

Through the system of struts and ball joints, aspects of the current invention provide motion isolation in six degrees of freedom: three translational degrees of freedom parallel to each of the Cartesian axes, and three rotational degrees of freedom, such as may be expressed with Euler angles. The same system of struts also supports the weight of the payload. According to various aspects, the average trajectory of the payload may follow the average trajectory of the carrier, with maximum deviations of the payload from its equilibrium position to be limited by the space available in the carrier. Accordingly, the amplitudes of these deviations can be accommodated through the motion of the pistons in the cylinders.

Figure 2:
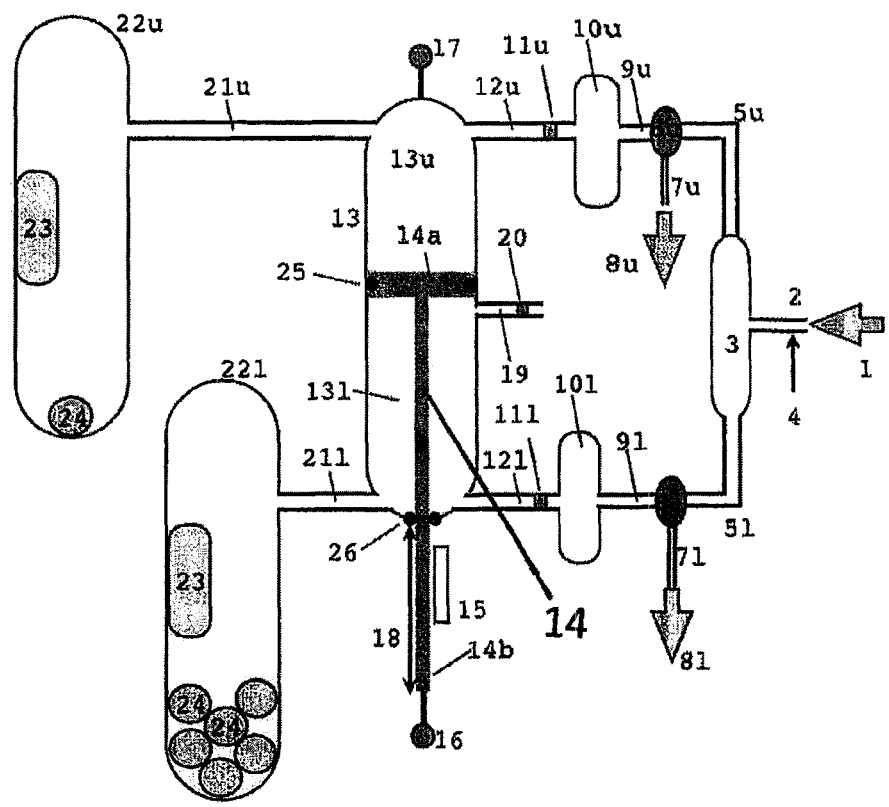
FIG. 2 is an illustration of a damping mechanism according to various aspects of the current invention.
Figure 2:
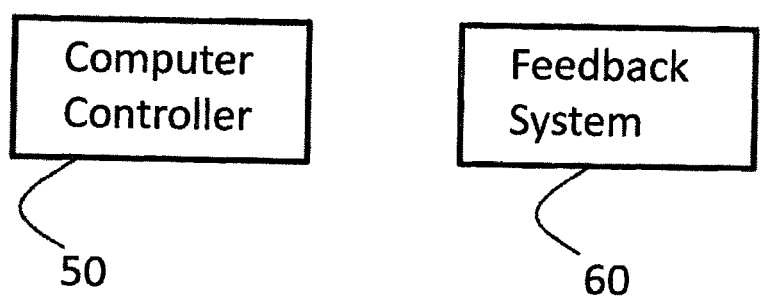

FIG. 2 is an illustration of a damping mechanism according to various aspects of the current invention. In FIG. 2, each strut may include an air cylinder 13, dual ported with an upper air supply port and a lower air supply port on the respective end caps, together with a piston consisting of a piston head 14a, a piston shaft 14b and a piston shaft seal 26. According to various aspects, the upper ball joint 17 may connect the cylinder to the frame, and the lower ball joint 16 may connect the end of the piston shaft to the basket. Additional components of the exemplary device may include an upper and lower pressure regulator 6u and 6l, upper and lower manifolds 10$u$ and 10$l$, inlet valve orifices 12$u$ and 12$l$, an exhaust vent and orifice 19 and 20, a friction clutch 15, and a plurality of accumulators 22$u$ and 22$l$.

According to various aspects, a computer controller 50 and a feedback system 60 may be provided to adjust an average position of the piston 14 by continuous measurement of the piston 14 and by additionally controlling the air pressures provided by the upper pressure regulator 6$u$ and the lower pressure regulator 6$l$, and to receive feedback with respect to air pressure in the struts, a length of the extension of the struts, and a motion of the basket and the tow frame. According to various aspects, the computer controlled feedback system 60 may adjust an average position of the piston 14 of a cylinder of each strut by continuous measurement of the piston 14 and by additionally controlling the air pressures in the pressure regulators 6$u$ and 6$l$ connected to the struts. Furthermore, the computer controlled feedback system 60 may also adjust dynamic properties of the apparatus by controlling the air pressure supplied to the struts by real time adjustments to the air pressure regulators 6$u$ and 6$l$, and by additionally controlling the air input and exhaust rates from each strut with a piezo-electric actuated valves, with feedback controlled using inputs from displacement sensors on the piston shaft 14$a$ connected to the piston 14 within a cylinder of each strut to deduce shaft displacement, velocity and acceleration in order to modify an effective spring constant, damping and mass of each strut.

According to various aspects, although FIG. 2 illustrates the feedback system 60 and the computer controller 50 not being directly coupled to the damping mechanism, the feedback system 60 and the computer controller 50 may be coupled to the damping system directly via wiring, or wirelessly, or via any other appropriate method.

According to various aspects, the accumulators 22$u$ and 22$l$ may be sealed containers capable of holding pressurized air that are ported separately to the upper and lower chambers of each cylinder. A purpose of the accumulators 22$u$ and 22$l$ may be to increase the effective length (decreasing the stiffness) of the cylinders by increasing the volume of pressurized air available to each chamber. The air supply ports on the cylinder end caps enable pressurized air to enter or leave each chamber of the cylinder, depending on the motion of the piston 14$a$. The ports may have the dual purpose of supplying air from the pressurized supply at a low rate so as to maintain an average pressure, and also to allow air to flow to the accumulators under dynamic loading freely enough so as to provide motion isolation over the desired frequency range. The interior surface of the cylindrical housing is smooth and permits low-friction traversal of the piston in a direction parallel to the axis of the cylinder. A friction clutch on the piston shaft below the exit orifice from the cylinder housing can be used to damp or lock the motion of the basket.

Figure 4:
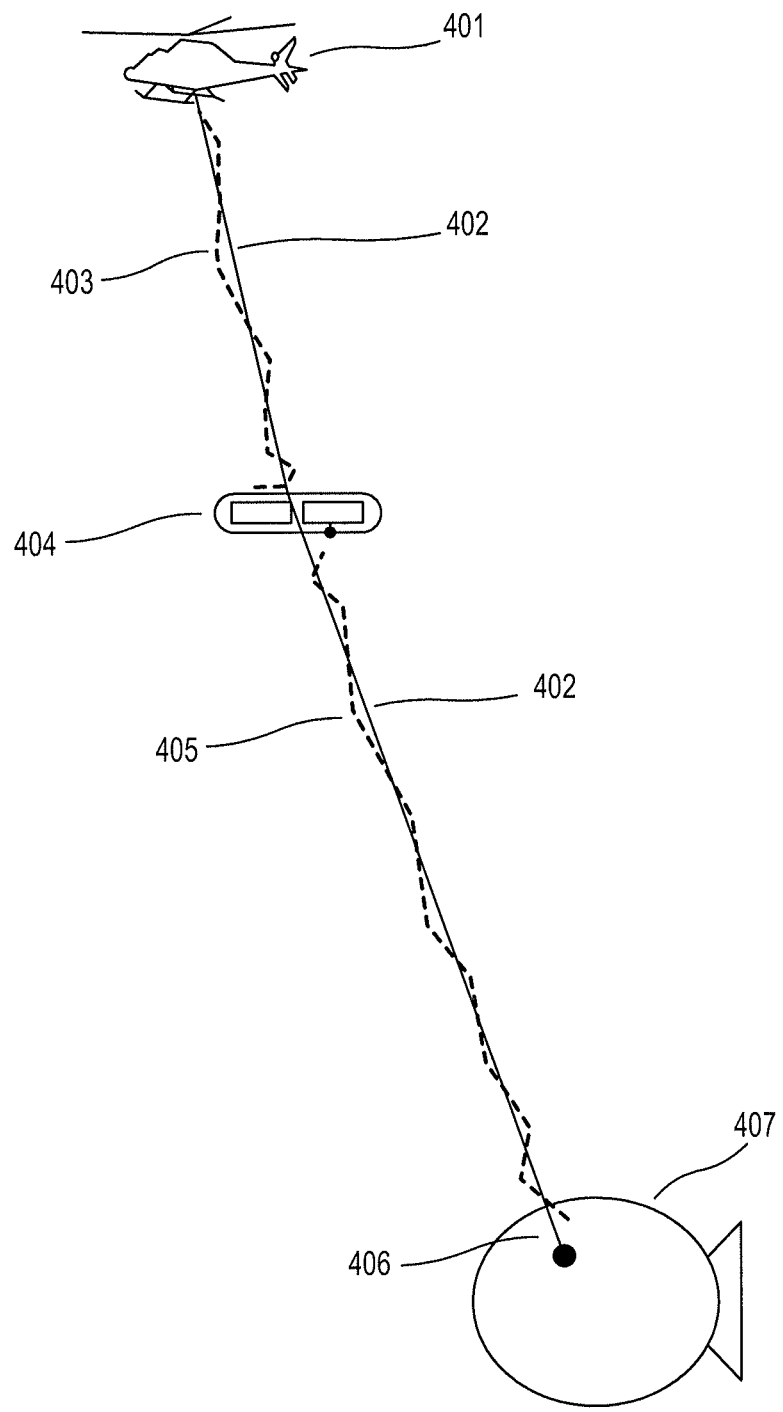
FIG. 4 illustrates an aspect of the current invention deployed in practice.

According to various aspects, air supply to the pistons may be provided by a compressor that feeds air 1 to a main input manifold 3 though a supply line 2. When aspects of the device are mounted inside flying carrier, as illustrated in FIG. 4 with the flying carrier 407 towed from the helicopter 401, the compressor 404 can be mounted on the tow cable 402 with an air supply line 405 leading down the tow cable 402 to the flying carrier 407. Power to the compressor 404 can be supplied by a line 403 connected to the helicopter power supply, and attached to the tow cable 402.

According to various aspects, referencing back to FIG. 2, from the main input manifold 3, pressurized air may be fed into independent pressure-regulated manifolds which then feed the upper chamber 13$u$ and the lower chambers 13$l$ in each cylinder. One pressure-regulated manifold, such as, for example, pressure manifolds 6$u$ and 6$l$, may be required for each air pressure setting, and in the case where two sets of struts are employed—vertical struts to bear the bulk of the load and inclined (or horizontal) struts to damp torsional and lateral motions—four such pressure-regulated manifolds may be required: each type of strut requires distinct upper and lower chamber pressures. According to various aspects, the purpose of the pressure regulators is to maintain the pressures, on a time average, in the two chambers as is necessary to support the load, (as determined by the difference in upper and lower pressures), while also providing the required spring constant to isolate the basket from motions of the carrier (as determined by the average of the top and bottom pressures). Air supply inlet valves 11$u$ and 11$l$ may be inserted into each air supply line leading from the pressure-regulated manifolds 10$u$ and 10$l$ to the cylinder chamber to act as a high-cut filter on the air pressure between the pressure-regulated manifolds 10$u$ and 10$l$ and the chambers 13$u$ and 13$l$. The inlet valve 11$u$ and/or 11$l$ limits the rate of air flow into and out of each cylinder, and so also limits the rate at which the air in the chamber can be exhausted through to the inlet valve manifold and the regulator. The result is that the time-averaged air pressure in each chamber is maintained at a constant level. However, transient pressure variations in the chambers are capable of reacting to the motions of the pistons.

According to various aspects, the mass that can be supported by each strut depends on the differential pressure on the piston head 14$a$. The spring constant depends on the absolute pressures in the cylinder. Hence, the strut design permits the spring constant of the motion isolation to be set independently of the payload mass, because the pressures in each chamber can be set independently. Accordingly, the invention in the present disclosure has advantages over conventional pneumatic systems that vent the air from the piston head directly to the atmosphere, because in such systems, one of the cylinder chambers is at atmospheric pressure. In those conventional systems, the pressure that supports the mass also determines the spring constant, since both the average and differential pressures across the piston head are simultaneously determined by the one chamber pressure. In such conventional systems, additional measures such as feedback can be employed to modify the spring constant—mass relationship governing the motion isolation of the system.

In order to understand more quantitatively how the strut element according to aspects of the current invention can be adapted to suit the requirements of the suspension system, the single strut of FIG. 2 in which the cylinder 13 includes a piston 14 at the centered equilibrium position (FIG. 2 shows the piston slightly above the equilibrium position) can be considered. The upper and lower pressures in chambers 13$u$ and 13$l$ may be imposed by the pressure regulators so as to support a static load L and so as to provide an effective spring constant dF/dx of K. For adiabatic compression, where heat is not transferred into or out of the system:

$$PV^{-\gamma}=C \tag{4}$$

where C is a constant, and where γ is the ratio between the specific heats of gases in the chambers 13$u$ and 13$l$ at constant pressure and at constant volume, and where for dry air is about 1.4. Equation (4) above assumes that mass is conserved, and so is a simplification of the system used in aspects of the current invention, where gas can be admitted to and exhausted from the cylinders, but it is nevertheless illustrative of how the pneumatic system can be designed. From the adiabatic gas equation, two equations can be derived for K and L:

$$K=\gamma(Pl+Pu)A^2N \tag{5}$$

$$L=(Pl-Pu)A \quad (6)$$

where Pl is the pressure of the lower chamber, Pu is the pressure in the upper chamber, A is the area of the piston, L is the static load and V is the sum of the volumes of the chamber and the accumulator and is assumed to be the same on top and bottom. A further simplification can be made where the piston area is the same for top and bottom surfaces of the piston head, and as a result the cross sectional area of the piston shaft is negligible. The following equations allow the pressures to be determined for any set of the design parameters A, V, F:

$$Pl=(KV+\gamma LA)/(2\gamma A^2) \quad (7)$$

$$Pu=(KV-\gamma LA)/(2\gamma A^2) \quad (8)$$

The fact that the pressure in the upper chamber (with the lower pressure) must be above atmospheric pressure, Pa, places limits on the ranges of K and L that can be accommodated because:

$$(KV-\gamma LA)/(2\gamma A^2)>Pa \quad (9)$$

When the load L is too large, or the desired spring constant K is too small, the inequality is violated. Accordingly, this situation can be addressed by increasing the accumulator volume V or decreasing the cylinder area A.

An aspect of any pneumatic suspension system is the requirement to keep the average piston position centered on the cylinder so it can provide maximum stroke accommodation for vibration isolation. The re-centering function is particularly important on a mobile carrier, where small changes in attitude can cause the loads on the supporting struts to shift, changing the static position of the load relative to the carrier. The consequent change in the location of the load can feed back into the carrier dynamics, particularly for the case of a towed carrier, where the centre of mass may shift relative to the centre of lift. Such a shift could further alter the attitude of the carrier with the potential to either set-up an oscillatory coupling between the attitude of the carrier and the location of the load within it, or to force the load and the carrier attitude to extremes governed by the mechanical limits of the struts, effectively disabling the motion isolation functionality of the invention. Such oscillations and tendencies to wander to extreme limits of the system may be mitigated by including an exhaust vent 19 in the cylinder towards its centre. In the case where the piston is displaced upward exposing the vent, air in the lower chamber may be vented and the pressure in the lower chamber may drop by a proportion determined by the ratios of the pneumatic resistances of the vent and feed orifices. The resulting differential pressure setup by the bleed may slowly restore the piston to its equilibrium position. Similarly, the downward displacement of the piston head in the cylinder may create an upward gentle restoring force on the piston head by causing air to be vented from the upper chamber. In dynamic (oscillatory) situations where the piston head rapidly traverses the cylinder as the invention accommodates carrier vibration, this restoring effect applies to the average position of the piston head because it biases the average location of the extrema of travel towards the centre of the strut.

According to various aspects, the exhaust vent may consist of a small orifice perforating the cylinder housing at its midpoint, into which an exhaust line is tapped. An orifice in the exhaust line may this control the exhaust flow rate which in turn controls the rate of change in pressure on the side being vented. Thus the speed at which the average piston head position is driven back to centre after a change in the static load may be controlled by the size of the vent orifice and the average pressure supplied by the pressure regulators. Accordingly, by adjusting the orifice sizes in the input lines and the exhaust vent, aspects of the current invention may be further adapted to isolate the payload from carrier motions in a particular frequency band. In practice, air is permitted to exit the exhaust manifold at a faster rate than air is supplied through either input line, thus allowing the pistons to naturally return to their equilibrium positions in the struts. According to various aspects, the restoration time constant for this action may depend on the air pressure regulators that control the airflow to each chamber, the sizes of each of the orifices that control the air flow in the input lines, and the flow rate through the exhaust manifold.

Accordingly, over short periods of time, corresponding to motions above 1 Hz in aspects of the current invention, the instantaneous pressure in the cylinder may be a function of the displacement of the piston head from its equilibrium centered position, where the strut acts as an air spring. Over long periods of time, the average pressure variation over the piston head is controlled by the pressure regulators, the orifices or air inlet valves, and the vent, where these elements return the piston to its equilibrium position. In practice, therefore, the time constant to restore the cylinders to their equilibrium positions is longer than the time constant required by the motion isolation. Accordingly, pressure regulated air is fed to each cylinder through the upper and lower air supply ports, such that a difference in air pressure is created between the upper chamber and the lower chamber across the piston head.

According to various aspects of the current invention, for times shorter than the restoration time constant, the displacement of a piston from its equilibrium position may create a decrease in volume in one of the upper or lower chambers. This change in volume may increase the pressure in the smaller chamber inversely with the remaining volume, with the restoring force on the piston increasing proportionally as the pressure differential across the piston head. If the displaced air volume is limited to that of the cylinder, the inverse relationship of pressure to volume may cause the effective spring constant of the strut to change, and may increase the stiffness of the piston as the displacement becomes larger. To accommodate large motions of the piston while providing for low, uniform stiffness, air accumulators 22*l* and 22*u* may be added to each cylinder, effectively increasing their volumes. The use of accumulators to augment the volumes of the chambers is particularly necessary in applications where space is limited and the cylinders must be short.

According to various aspects, using an accumulator to increase the effective volume of the strut decreases the variation in the strut's stiffness with piston position by increasing the effective length of the cylinder. In practice, the volume of the accumulator may be large in comparison with the volume of the strut, causing the restoring force to increase linearly (to a good approximation) with displacement. The restoring force of the air pressure can thus be treated in accordance with Hooke's Law.

An advantage of using a pneumatic damping system rather than an elastomeric one (for example, one using bungee cords and/or rubber supports) is that the effective spring constant of the pneumatic system is proportional to $A^2/V$ and so can be (lowered) by the addition of accumulator volume and/or the reduction of cylinder area. In an elastomeric system, this same functionality is accomplished by increasing the length of the elastomers, and is not a practical option where space is limited. In a towed carrier, or other carrier where space is at a premium, accumulators can be built into any available spare volume, without appreciably affecting the distribution and total mass of the carrier. In an elastomeric damping system, the same effect can only be achieved by lengthening the supporting springs. Accordingly, in cases where the carrier volume is small, elastomer-based vibration damping solutions that require long components can be difficult to implement, and may require the use of pulleys or similar devices to meet the volume constraints. However, the use of pulleys with elastomeric compounds can create unwanted frictional damping as the elastomer deforms around the pulley, creating an over-damped suspension that has poor motion isolation properties at low frequency.

According to various aspects of the present invention, damping may be provided by the friction of the pistons 14a as they move in their cylinders, and can be adjusted by varying the type and tightness of the piston seals 25 and 26, with dynamic changes applied by engaging a friction clutch 15 on the piston shaft. In addition to damping the motions of the pistons, the friction clutches can be used to lock the struts into position, as may the required when the invention is not in service or when the air supply is not engaged.

According to various aspects, the role of damping may be to remove vibrational energy from the system, particularly at the system resonance, where the vibration isolation system may amplify transmitted vibrations rather than reducing them. While increased damping diminishes unwanted amplification of vibration near the resonant frequency, it also diminishes the effectiveness of the isolation of the system within the isolation band, which is twice the resonant frequency and above. The ideal damping may therefore be a tradeoff which depends on the amount of excitation near the resonance frequency that is imposed from the outside, so the means to control damping is therefore a valuable system attribute.

Damping is conventionally achieved via the use of frictional elements which eliminate energy in proportion to the velocity of the piston relative to the cylinder. In the equations above, in which the transfer function of a simple mass-spring-damper system was derived, this is the usual way damping is handled. In aspects of the present invention, low-frequency energy is also released by venting air through air supply orifices. Energy is lost whenever air is exhausted from the exhaust vent, that is, when a piston departs from its equilibrium position. Air is also exhausted whenever the chamber air pressure exceeds the limit of the regulator on its input supply line. Both air exhaustion mechanisms may damp the long-period (sub-resonant) motions of the basket with respect to the carrier, causing the basket to return to its equilibrium position more rapidly that would otherwise be the case in a simple mass-spring-damper system.

Figure 5A:
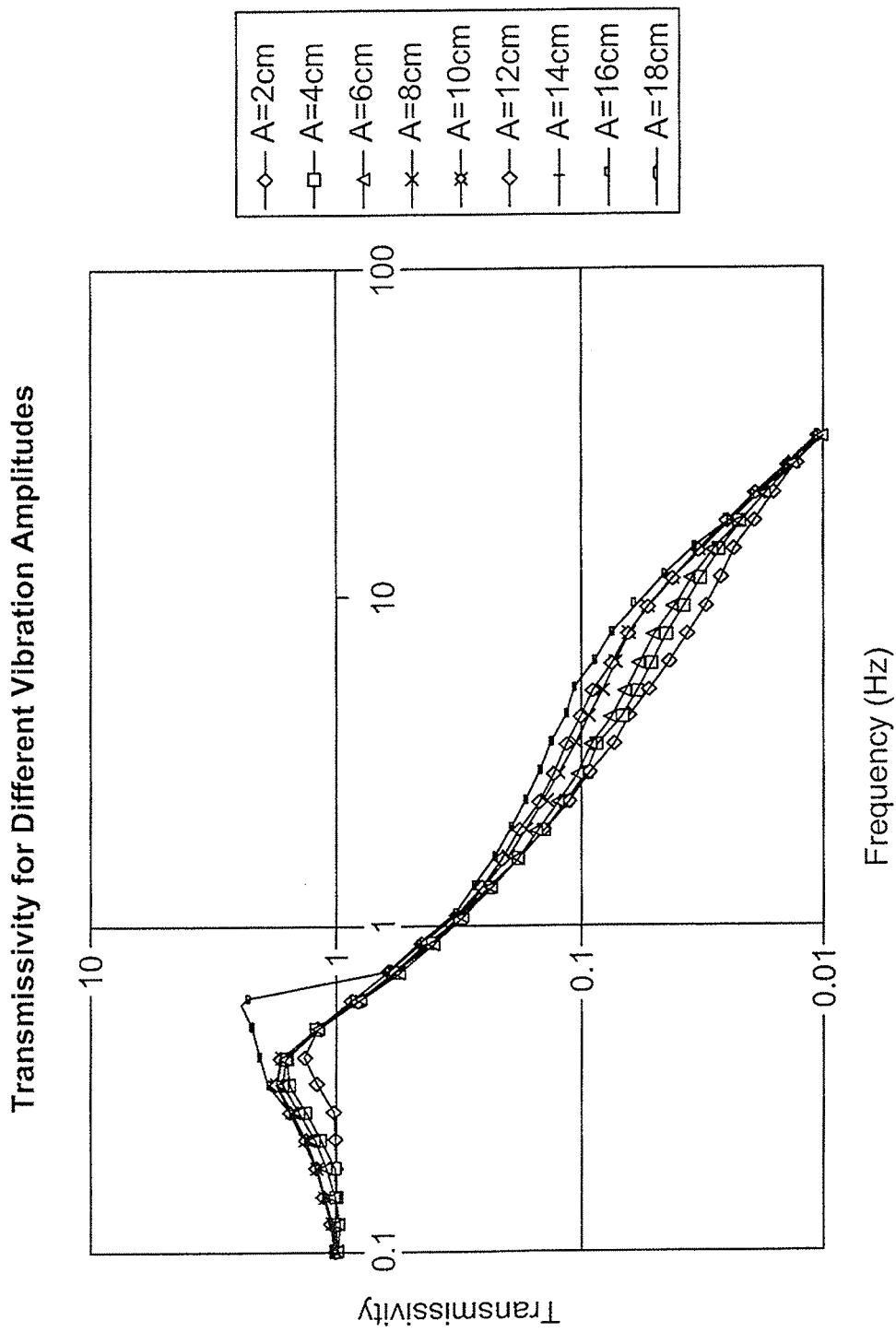
FIG. 5A illustrates transmissivity as a function of frequency for the baseline vertical struts, according to various aspects of the current invention.

The vibration isolating properties of the invention can be adjusted to accommodate the displacement spectra experienced by different carriers. An example of this is illustrated in the results of the following simulation. FIG. 5(A) illustrates transmissivity as a function of frequency for the baseline vertical struts, accounting for non-linear effects with respect to vibration amplitude (A) introduced by the pneumatic orifices. The different curves are for differing excitation amplitude. Note the system is nonlinear as the curves are all different. The largest excursions corresponding to amplitudes of 16 and 18 centimeters result in the suspension bottoming out near the resonance frequency of about 0.7 Hz. While the curves show some differences due to the nonlinearity, they display transmissivities below 0.1 for frequencies greater than 2 Hz, the performance being somewhat worse at higher amplitudes. Most important is the fact that the overshoot that occurs near resonance is kept to well below 2 times enhancement.

Figure 5B:
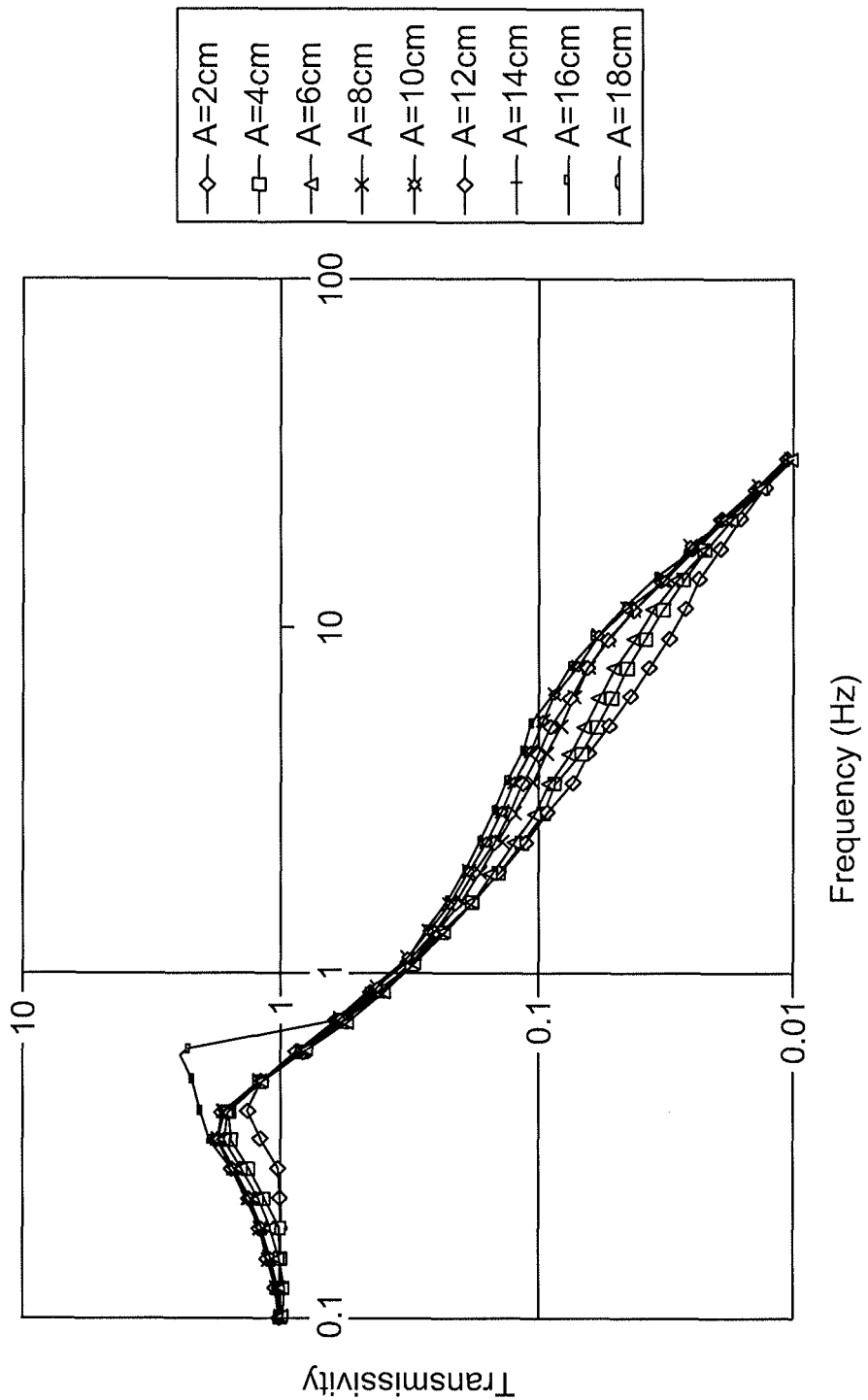
FIG. 5B illustrates the role of the damping through a friction clutch rubbing on the shaft, according to various aspects of the current invention.
Figure 5C:
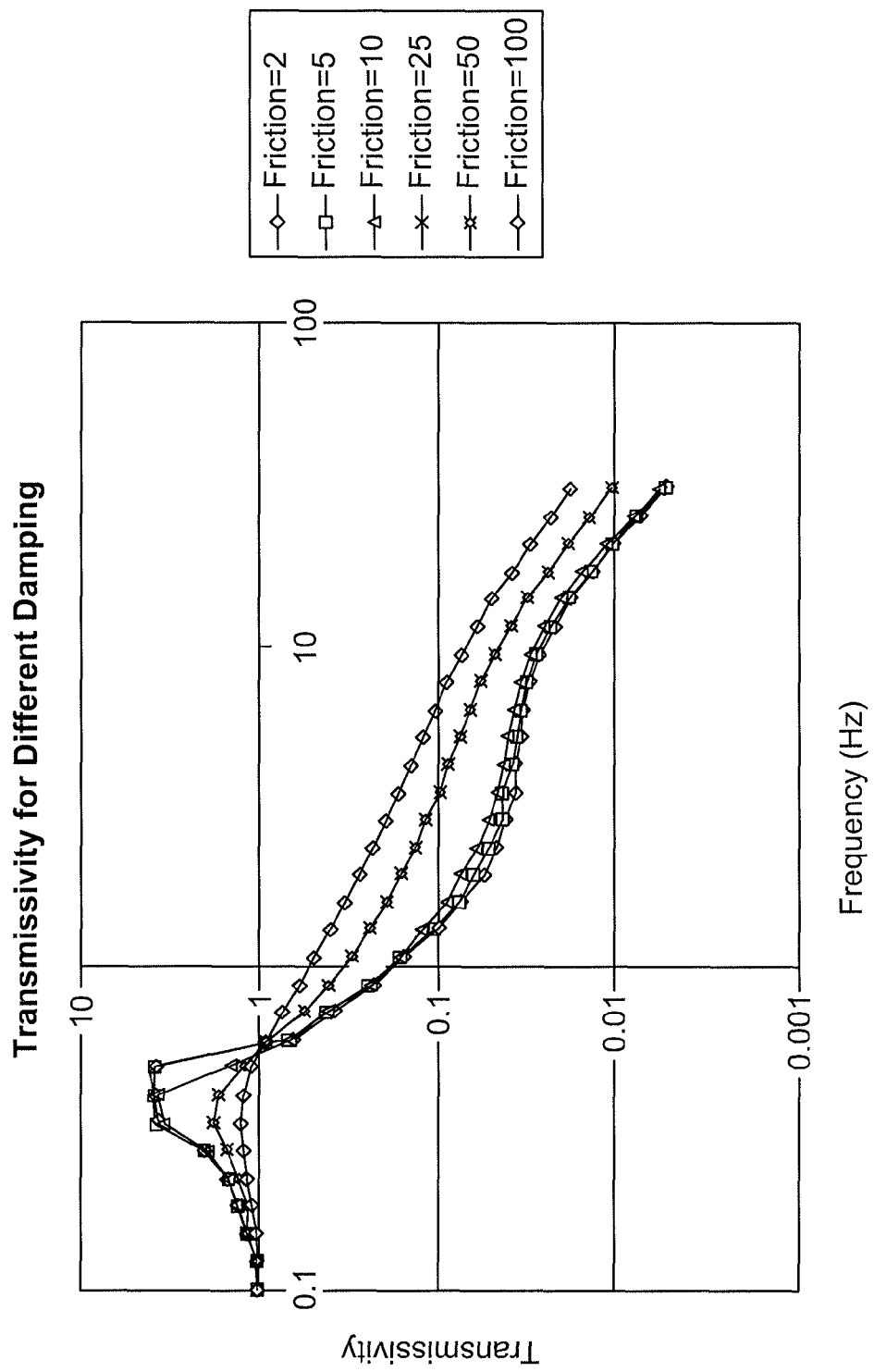
FIG. 5C illustrates transmissivity as a function of damping, according to various aspects of the current invention.

The role of the damping through a friction clutch rubbing on the shaft is shown in FIG. 5B. Increasing the friction decreases the height of the enhancement peak near resonance but it decreases the performance at higher frequencies. Clearly the choice of the level of friction is a trade-off and may depend on the spectral nature of the imposed forces experienced by the carrier. It is therefore important that this be a highly tuneable parameter.

Aspects of the invention may be applicable to isolating sensors that are mounted in towed airborne survey carriers, such as is commonplace in geophysical exploration, mapping, and remote sensing, although those skilled in the art may understand the usefulness of this invention is not limited to such applications alone. For example, aspects of the invention can be deployed in a variety of carriers other than those cited including, for example, mobile airborne, ground and waterborne vehicles, towed or floating carriers, as well as in stationary installations. In the case of stationary installations, which are distinct from the case of mobile installations, aspects of the invention may be used to isolate an instrument or other payload from building vibration. The invention is scalable, with the size of any embodiment of the invention determined by the characteristics of particular motion isolation application to which it is applied, including the mass of the payload and the frequency band in which motion is to be isolated. Aspects of the invention are not limited to a particular size, and the size can vary depending on the amplitude of the displacements or the frequencies that must be damped. For example, the size of the tow frame and suspension apparatus employed in the invention can be increased so as to reduce the effective lower frequency from 1 Hz to 0.1 Hz and below.

Advantages of aspects of the current invention in the present disclosure include the ability to be operated entirely by tapping into the power supply available from a medium lift helicopter, so additional power generation capacity may not be necessary to run the pneumatic system. While many systems are passive and require no power at all, certain motion-isolation systems rely on large amounts of air and motor-controlled 3-axis racks, and so can require large amounts of power. Other aspects relate to a suspension apparatus that can be assembled and disassembled so as to facilitate transportation of the survey apparatus from place to place. Other advantages include the ability to be largely constructed from electrically-resistive and non-magnetic composite materials, making it light and resistant to eddy current induction and induced magnetization within its parts, a particular advantage when making an electromagnetic measurement where low noise levels and minimal disturbance to the ambient fields is required.

Various applications and advantages may be at least the following: i) compact size compared to other motion isolation inventions, such as bungee based systems, operating in a similar motion isolation frequency band; ii) ability to operate from available helicopter power; iii) relatively light weight compared to some other motion isolation inventions; iv) tunable independently for spring constant and static load bearing capacity; v) capable of largely being built from resistive materials and low-electromagnetic noise components, so as to minimally distort the ambient electromagnetic field; vi) portability: capable of being installed on a mobile carrier; vii) capable of being used over a large thermal range in an outside environment with minimal change in isolation characteristics; viii) capable of being assembled and disassembled for transportation to different sites; ix) capable of isolating motion amplitudes on the order of 40 cm above 1 Hz, such as is typical for a carrier towed below a helicopter in airborne geophysical survey operations; and x) lockable and unlockable basket motion.

Aspects of the invention include a damping device that is light and compact enough to be deployed in a carrier towed by a medium lift helicopter for a flight lasting several hours. Those skilled in the art may realize that such a carrier can also be towed from, among other things, a vertical-takeoff aircraft, airship or fixed wing aircraft. Advantages of aspects of the current invention include supporting a payload that includes high precision, low frequency magnetometers within a carrier towed from an aircraft. Accordingly, the following characteristics may be present in aspects of the current invention:

- the trajectory of the payload may follow the trajectory of the carrier in such a fashion that the high frequency deviations (vibrations) in the carrier trajectory (above 1 Hz) are damped from the payload trajectory, where the amplitude of isolated motion can extend to 40 cm and,
- the disclosed invention is electromagnetically quiet, so that the payload can consist of highly sensitive electromagnetic sensors, such as magnetometers operating in the 1 pT/root-Hz noise range at 1 Hz, and
- the entire carrier, incorporating the invention and payload, weighs under 800 pounds and so can be deployed with a medium lift helicopter for flights of duration of 2-4 hours, making it practical for airborne geophysical surveys, and
- the invention can be operated from available helicopter power According to various aspects, a motion isolation apparatus for isolating an SP or other payload from the high frequency motions of a towed survey carrier above 1 Hz, comprising of an annular tow-frame defining a supporting structure from which the motion-isolation apparatus is hung 101, 102 and 103, a basket 301, 302, and 303 upon which the SP payload and additional optional motion isolation apparatus is mounted, a plurality vertical pneumatically controlled piston-struts 202 to isolate and damp vertical motions of the basket as well as to support its weight, a plurality of diagonally inclined or horizontal pneumatically controlled piston-struts 201 to isolate and damp the lateral and torsional motions of the SP, low friction ball-joints 16 and 17 that connect the top of each strut to the tow frame and the bottom of each strut, by means of a piston 14, to the basket, an air compressor, air filter, dryer and supply line to pressurize supply manifolds 3 from which to deliver clean, dry air to the struts, a set of electronically controlled pressure regulators 6 and optionally, electronically controlled valves, to tap the manifolds 10 and so provide air according to the pressure and flow rate requirements of each strut through air supply orifices 11, a plurality of air accumulators 22 attached to each strut to allow the effective volume of the air in the strut to vary so as to match the desired spring constant for each strut, an exhaust vent 19 and orifice 20 located at the equilibrium location of the piston head in each cylinder, an optional set of air pressure sensors in each strut to monitor the air supply to each strut, an optional displacement sensor on each strut to monitor the displacement of each piston, motion sensors on the tow-frame and basket to monitor the motion of the basket and the tow-frame, and a computer to control the regulators and valves, and so adjust the air flow to each strut based on the input from the pressure, displacement and motion sensors.

Aspects of the current invention include nine struts of which three are vertically oriented, with the remaining six inclined from the horizontal at the same angle. The preferred embodiment of the invention requires two separate upper manifolds and two separate lower manifolds to service all struts, as the six horizontal and three vertical struts operate under separate pressure settings. The exhaust vent may consist of a single 0.4 mm diameter hole in the wall of the main cylinder, connected to a pipe in which an orifice is inserted to control the low-pass filtered characteristic of the exhaust air flow. The tow frame may be rigid and securely attached to a towed carrier. According to various aspects, the accumulators measure approximately 7.5 cm in diameter by 50 cm in length, providing 10 liters of volume and are constructed of carbon composite, but those skilled in the art may understand that other dimensions, pressures and constructions are possible. A port on the side of each accumulator permits access to the interior. By placing solid objects inside the accumulator, the accumulator's volume can be reduced to match the vibration isolation characteristics required by the payload and carrier pair. In the preferred embodiment of the present invention, accumulators are mounted on the tow frame.

For example, a configuration of an exemplary vertical strut in the current disclosure may be as follows:

Cylinder diameter: 4.4 cm
Cylinder length: 50 cm
Accumulator volume: 10 l
Upper chamber pressure: 282 kPa
Lower chamber pressure: 578 kPa
Suspended mass: 40 Kg
Friction: 50 N-s/m
Travel: 40 cm peak-to-peak Accordingly, in the preferred embodiment of the invention of the present disclosure the load is approximately 40 kg, the spring constant 150 N/m, the volume 0.01 m^3 and the cylinder area 0.0013 m^2. This yields an upper pressure of 578000 Pa and a lower pressure of 282000 Pa or gauge pressures in imperial units of 71 and 27 pounds per square inch. The load may be supported by 3 vertical piston-struts suspended vertically from the tow frame whose primary purpose is to support the weight of the basket and control vertical motions. The load may be supported by 6 diagonal piston-struts suspended at an angle inclined from the horizontal whose primary purpose is to control lateral and torsional motions. The payload may be a sensor platform mounted on an air bearing, and the sensors are magnetometers with a noise floor of 1 pT/root Hz at 1 Hz, which are mounted on the sensor platform, as described in U.S. patent application Ser. No. 12/688,565, from which this application claims priority. Sources of electromagnetic noise that could be generated in the mechanical components of the invention may be minimized. Eddy current induction in the mechanical components of the preferred embodiment is minimized through the use of resistive composite materials. Where metal parts are required, non-magnetically permeable metals are used. Low-noise piezo-electric actuators are used to control the valves.

It should be understood by those skilled in the art that the substitution of a composite or plastic for any other material with suitable mechanical properties may not substantially change the functionality of the invention of the current disclosure, and that the use of composite materials is primarily to enable low-noise electromagnetic measurements to be made on a sensor platform transported on the basket. It should also be understood by those skilled in the art that the substitution of a valve or another actuator for any piezo-electric actuator with suitable mechanical and electrical properties may not substantially change the functionality of the invention of the current disclosure, and that the use of piezo-electric actuators materials is primarily to enable low-noise electromagnetic measurements to be made on an sensor platform that is mounted on the basket.

According to various aspects, the tow-frame defining the support structure is fabricated from a resistive composite material, the pneumatic cylinders are fabricated from composite to minimize eddy-currents, ball-joints are fabricated from a low-friction, high strength plastic, to minimize weight and eddy-currents, the ball-joints are fabricated from a self-lubricating plastic to minimize friction and the associated mechanical noise caused by frictional rubbing, and impulsive motion noise caused by friction, the payload is mounted in a basket that is fabricated from a composite, and suspended from the struts, the control valves are piezo-electric actuated as may be necessary to reduce noise to minimize electromagnetic noise, all fittings and couplings are fabricated from a composite as may be necessary to suppress eddy currents to minimize electromagnetic noise, the orifices that admit air into the piston-strut are bevelled on the interior surface of the piston-strut to permit unimpeded passage of the piston head past the air supply orifice, air pressure and so flow rates from the air supply are computer controlled to adjust for the load on the basket, the kinematic properties of the flight, and the motion isolation requirements of the payload, the volume of the accumulators can be adjusted to match the stiffness of the suspension the load and dynamical requirements of the system.

According to various aspects, the tow frame may consist of two concentric circular rings 101 and 102 joined together by rigid beams 103 forming an annular triangular lattice, such that the inner ring is above the outer ring and supports the vertical piston-struts and the outer ring serves to provide attachment points for the diagonal struts used to additionally constrain the torsional and lateral motions of the basket, the tow frame and suspension apparatus are housed within a towed carrier 407 or sonde which is suspended from a helicopter 401 by an 80-meter tow cable 402, compressed air for the struts is furnished by an air compressor that is mounted within a housing 404 affixed to the tow cable 15 meters below the helicopter, the compressor may be electrically powered by a 70-Amp source taken from the helicopter 403. Compressed air is fed to a manifold located in the tow frame by a 50-meter hose 405, from which the compressed air is distributed to each of the cylinders. The purpose of mounting the air compressor 50 meters from the basket may be to limit any electromagnetic noise that is generated by the compressor at the sensor platform.

According to various aspects, where suppressing electromagnetic noise is not important due to the nature of the payload, parts of the invention may be constructed of composites or plastics can instead be constructed of metals, and magnetically permeable and magnetically polarized metals may be employed in its construction. In other aspects, air control valves may use non-piezo electric actuators. Other aspects of the invention can employ various cylinders or combinations of cylinders operating at a single or a plurality of pressure settings, as may be required by the specifications of the isolation system. According to various aspects, a separate embodiment of the invention can serve as the payload, the action of the air in the pistons may be assisted by springs or similar mechanical means, the carrier may be other than a carrier, a separate pair of pressure regulators and a potentiometric linear transducer are required for each cylinder. Feedback is based on the measured average position of each cylinder and the upper and lower pressures are modulated to keep the average piston position centered on the cylinder. The air supply requirements of these embodiments are similar to that of the preferred embodiment.

According to various aspects, a separate pair of pressure regulators and a potentiometric linear transducer may be required for each cylinder. Feedback is computed from displacement sensors on each piston and pressure sensors on the input lines to effect computer controlled adjustments to the air pressure regulators attached to the two ports. Pressure and displacement sensors feed the state of each strut and the location of the basket to the motion controlling computer. The computer then adjusts the air supply to the cylinders and the action of the friction clutches on each piston shaft to modify the effective mass, damping and spring constants required to optimize the motion of the payload relative to the carrier. The air supply requirements of these embodiments are much higher than those of the preferred embodiment. The struts may support the load of the basket from below, by virtue of being mounted to a frame located below the basket, the struts may also support the load from above and below by virtue of being mounted to a frame that surrounds the basket, and the tow frame may assume a non-annular form, or may contain internal damping means, or both. The components of the pneumatic system are illustrated schematically in FIG. 2 for the case of a system with a single cylinder. Input compressed air 1 is admitted through an input supply line 2 into a supply manifold 3 with the input pressure monitored at point 4 by a pressure sensor. Supply lines 5 lead from the supply manifold 3 to feed the upper and lower chambers 13*u* and 13*l*, respectively, in each cylinder 13 through supply lines 5*u* and 5*l*, respectively. Pairs of upper and lower supply lines are required for each set of cylinders that require common air pressures. According to various aspects, separate supply lines would feed air to the upper and lower chambers of the vertical and inclined sets of cylinders, for a total of four supply lines, only two of which are illustrated. The supply lines lead to the pressure regulators 6, upper regulator 6*u* and lower regulator 6*l*, on the respective supply lines. Excess air 8*u* and 8*l*, due to overpressure in the upper 13*u* and lower chambers 13*l* of the cylinder 13 is vented from the regulators through the exhaust lines 7*u* and 7*l*. The pressure regulated air is then fed into upper 9*u* and lower 9*l* pressure regulated supply lines and into the pressure regulated upper and lower distribution manifolds, 10*u* and 10*l* respectively. Each pressure regulated distribution manifold supplies air to the upper or lower cylinders that require the same source of pressure regulated air. For example, in the preferred embodiment of the present disclosure, three upper and three lower pressure regulated lines respectively feed each of the three upper and lower chambers in the vertical cylinders with air at a common regulated pressure, while and additional six upper and six lower pressure regulated lines respectively feed each of the six upper and lower chambers in the inclined cylinders with air at a common regulated pressure. In FIG. 2, only two such supply lines are illustrated. Pressure regulated air is then fed into the upper and lower supply lines 12*u* and 12*l*, respectively, which lead from the pressure regulated distribution manifolds to the upper and lower chambers of the cylinder 13. Orifices 11*u* and 11*l* are inserted in the upper and lower lines to regulate the air flow and so act as a low pass filter between the air pressure differential in the chambers of the cylinder and the respective regulated distribution manifolds. It should be noted that while the above description refers to air flowing from the pressure regulated manifolds into the respective chambers, air can also flow from the chambers and into the respective manifolds to be exhausted through the respective pressure regulators.

Each strut consists of a cylinder 13 with an upper chamber 13*u* and a lower chamber 13*l* separated by a piston 14*a,b* consisting of a head 14*a* and a shaft 14*b*, with the head partitioning the interior of the cylinder into the upper and lower chambers. An adjustable damping element 15 can act on the piston shaft as the piston moves in the cylinder to exert frictional damping as required, and can also be used to lock the piston in place. Seals 25 between the piston head and the inner cylinder wall are selected based on the desired friction, as are the seals 26 between the piston shaft and the exit orifice in the cylinder. Upper ball joint 17 connect the strut to the frame, while lower ball joint 16 connects the strut to the basket. Displacement sensor 18 provides input to the motion control computer. Air is exhausted from the strut through exhaust line 1) into which an orifice 2) is placed to control the exhaust rate. Upper and lower accumulators 22*u* and 22*l* are connected to the upper and lower chambers of the cylinder by lines 21*u* and 21*l* respectively to increase the effective volumes of each chamber. Removable openings 23 in the accumulators allow for the insertion of solid objects 24 to adjust the effective accumulator volume.

For the case where the pneumatic system consists of multiple cylinders acting with the same pressure, additional supply lines 12*u* and 12*l* may lead from their respective manifolds 10*u* and 10*l* to the additional cylinders and their respective components. In the case where the pneumatic system consists of multiple cylinders acting with different pressure settings, additional supply lines (5*u* and 5*l*) may lead from the supply manifold (3) to the respective pressure regulators, pressure regulated manifolds, cylinders and respective components.

Figure 3A:
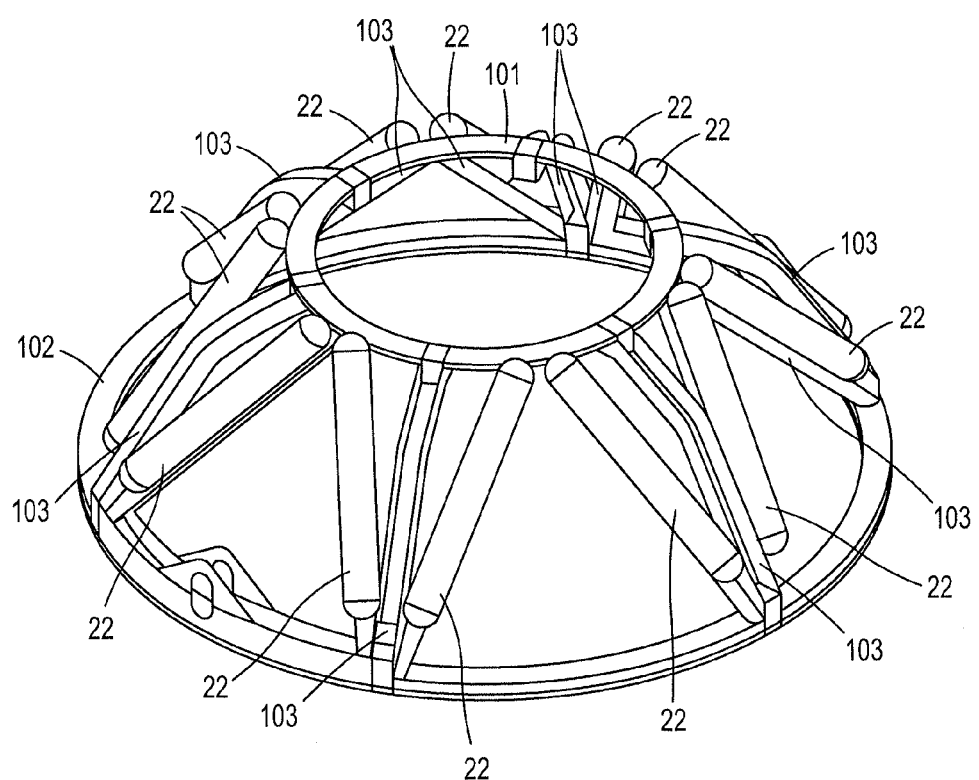
FIGS. 3A-D illustrate the layout of the accumulators 22 on the tow frame according to various aspects of the current invention.
Figure 3B:
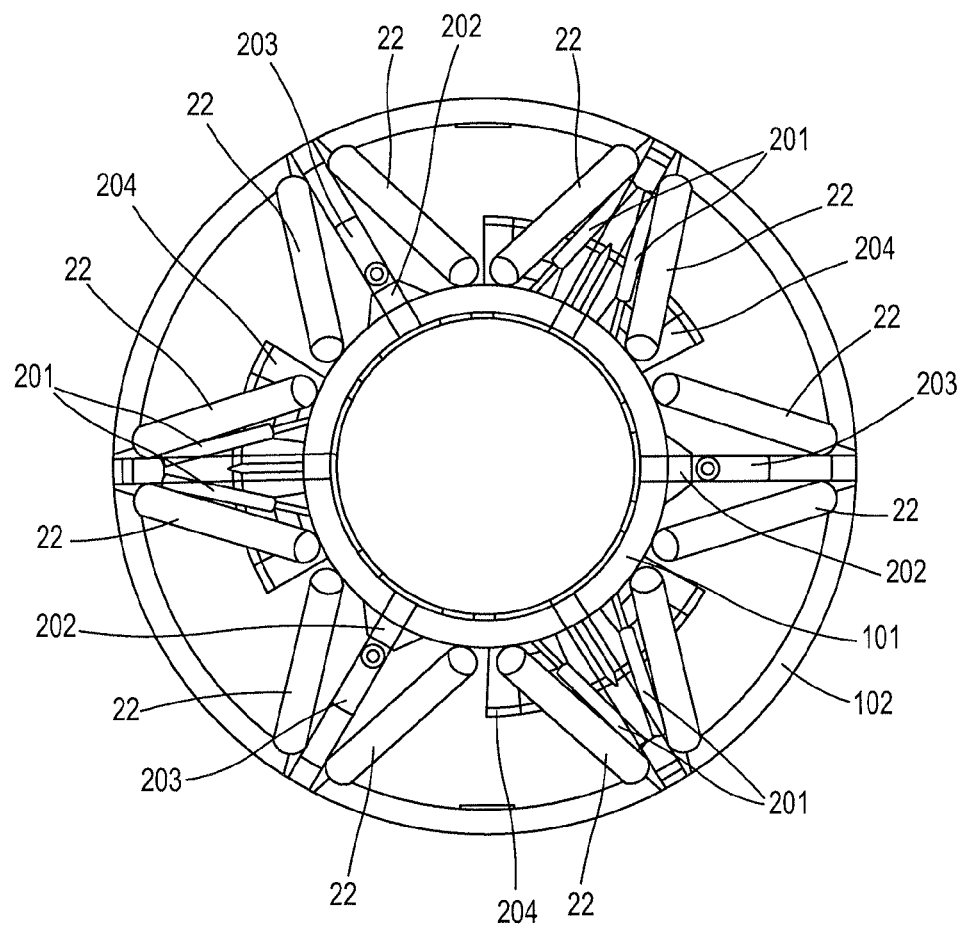
Figure 3C:
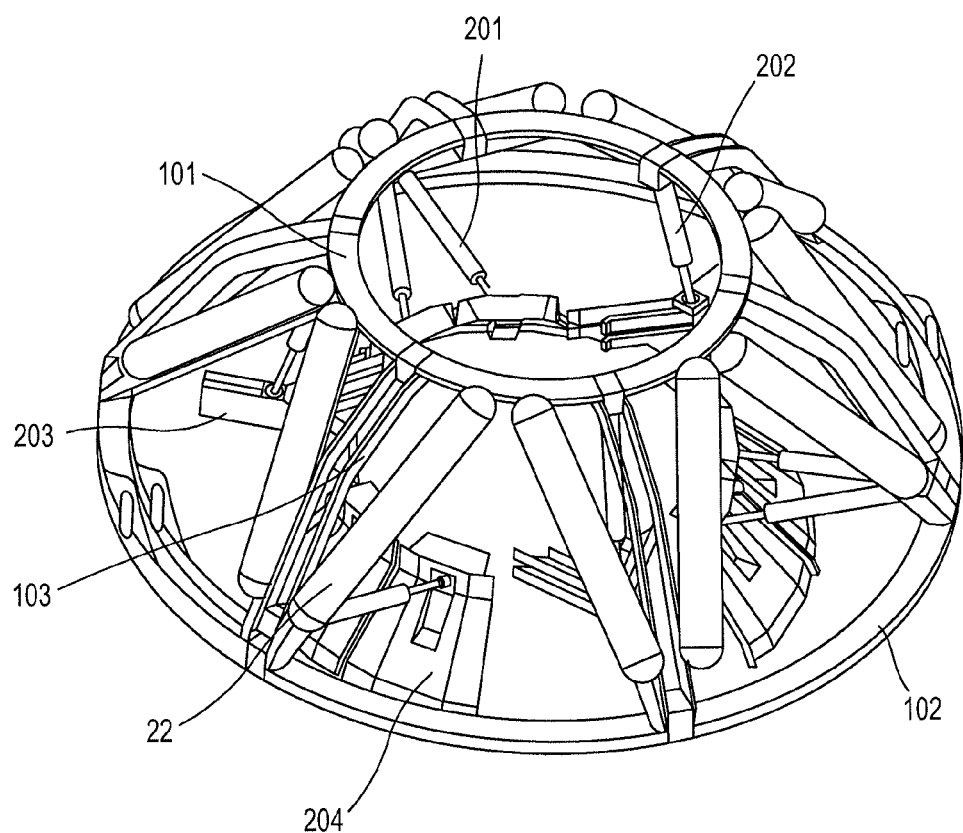
Figure 3D:
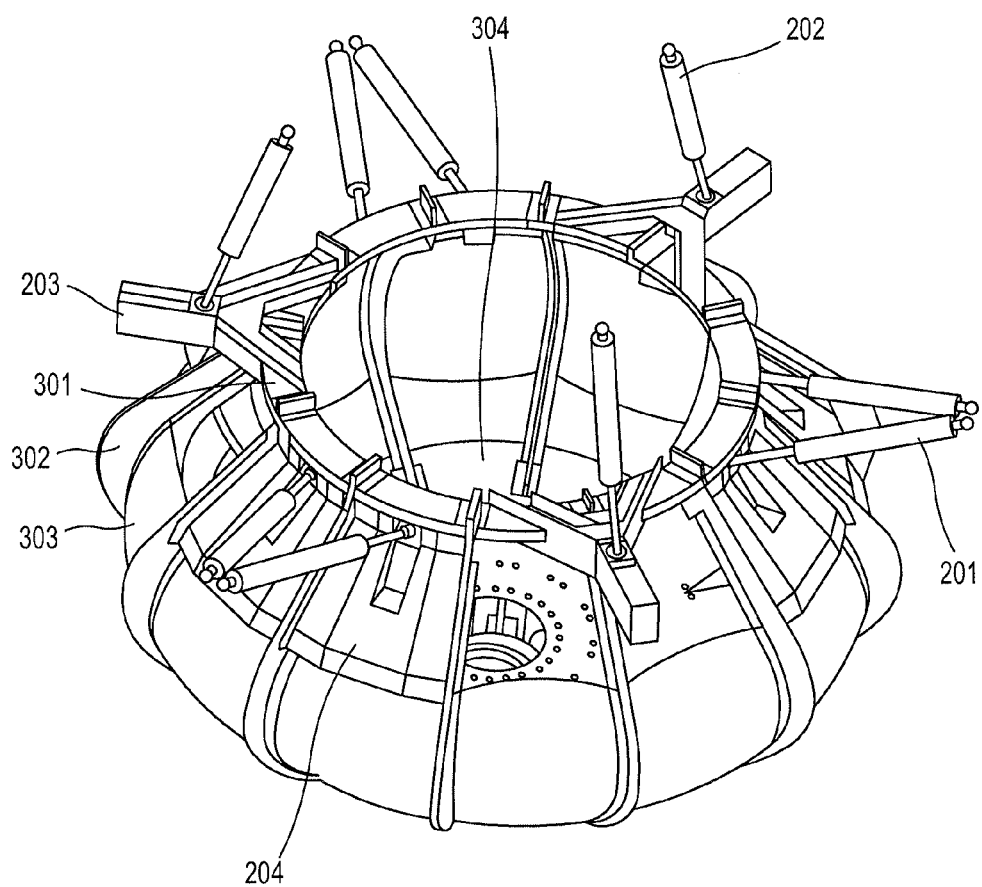

FIGS. 3A-D illustrate the layout of the accumulators 22 on the tow frame according to various aspects of the current invention. The tow frame consists of an inner ring 101 and a lower outer ring 102 connected by truss-members 103 on which the accumulators are mounted. FIG. 3B illustrate the accumulators and the tow frame in the preferred embodiment of the invention from a top view. The inclined struts 201 and vertical struts 202 are also shown, together with the rigid mounting structures, 203 and 204, used to connect the struts to the basket. FIG. 3C illustrates the same from a perspective view. FIG. 3D illustrate the arrangement of the struts 201, 202, the mounting structures connecting the struts to the basket 203, 204 as well as the construction of the basket in the preferred embodiment of the invention. The basket consists of an upper ring 301 onto which the mounting structures 203, 204 are affixed. The basket is of a rib 302 and panel 303 construction, with the upper ends of the ribs affixed to the upper ring 301 and the lower ends of the ribs terminated in a floor panel (304).

FIG. 4 illustrates an aspect of the current invention deployed in practice. Helicopter 401 supplies electrical power through a power line 403 attached to tow cable 402 upon which is hung an air compressor in a housing 404 powered by current from the helicopter. The resulting compressed air is led through a supply line 405, also attached to the tow cable, to the carrier 407 in which the invention is installed. The carrier is towed though the air by a tow yoke 406 to which is attached to an axle that supports the tow frame with the elements 101, 102, and 103.

Thus, in summary, the present apparatus and methods include one or more of the following aspects.

I. GENERAL: A pneumatic suspension method and apparatus for motion isolation of a payload from its carrier, comprising:

1.1 A tow frame consisting of concentric structural members with the inner member located above the outer member, with both members connected so as to form a support truss in the shape of an inclined annular triangular lattice, 1.2 A basket suspended beneath the tow frame upon which a payload consisting of a sensor platform or additional second suspension system can be mounted, and that is isolated from the motion of the tow frame in a particular bandwidth, 1.3 A set of three vertical pneumatic low-friction piston struts, dual-ported, connecting the basket to the upper, inner ring of the tow frame, said struts to bear the majority of the static load of the basket, and to isolate the basket from vertical motions of the tow frame, 1.4 A set of six diagonal (or inclined) pneumatic low-friction piston struts, dual-ported, connecting the basket to the outer ring of the tow frame, primarily to isolate the basket from translational and rotational motions of the tow frame, 1.5 An air supply pump to provide a source of compressed air, that for installations towed beneath a helicopter, can be mounted on a tow cable and separated from the tow frame and sensor platform by a distance of approximately 50 meters so as to isolate the payload from the electrical and mechanical noise of the pump, 1.6 An air supply pump capable of being powered from a standard helicopter power system, 1.7 An air supply system to clean and dry the pressurized air from the pump, and to feed the air via a hose to a supply manifold, for subsequent distribution to the pneumatic struts, such that for installations towed beneath a helicopter, the hose is mounted on the tow cable, 1.8 A set of four air supply lines, each leading to a computer controlled pressure regulator, and then from the regulator to an air distribution manifold, with the air pressure in each distribution manifold at a pressure determined by the computer control on the associated pressure regulator, 1.9 A set of supply lines leading from each air distribution manifold to the upper or lower chambers of the diagonal or vertical struts, with each supply line containing an orifice and an optional computer controlled piezo-electric valve, such that:

One set of such supply lines leads from one distribution manifold to the upper chambers of the vertical struts A second set of such supply lines leads from a second distribution manifold to the lower chambers of the vertical struts A third set of such supply lines leads from a third distribution manifold to the upper chambers of the horizontal/inclined struts A fourth set of such supply lines leads from a fourth distribution manifold to the lower chambers of the horizontal/inclined struts 1.10 Vents at the mid-point of each of the cylinders so as to allow air to be vented from the larger of the upper or lower chambers when the piston is displaced from its equilibrium position, such that the ventilation is at a rate determined by an exit orifice and optionally, a piezo-electric valve, where the air is vented in a manner to restore the strut to its equilibrium position when modest changes in the static load occur, 1.11 Computer controlled air pressures in each distribution manifold set to independently control the stiffness and static load bearing of each strut, 1.12 Air rates from the distribution manifolds to the pistons that are regulated by orifices, and optionally by piezo-electric valves, so as to control the time required to re-center the piston in response to step changes in the static load, 1.13 Sensors to measure the air pressure in the struts, the length of the extension of the struts, and the motion of the basket and the frame to provide feedback to the computer, 1.14 Data processing software in the computer which employs sensor input to manage the air supply to the struts through pressure regulators, and optionally, the piezo-valves, so as to control the motion of the basket, 1.15 Low friction, self-lubricating plastic ball joints which connect the upper end of the struts to the tow frame and the lower end of the struts to the basket, 1.16 A suspension system with struts tunable to bear different payload masses by permitting the differential air pressure across the piston head in the strut to be varied, 1.17 A suspension system with struts tunable to different spring constants, by:

using variable volume accumulators connected to the upper and lower chambers of each cylinders, and so to change the effective volume of the air within those chambers, and by permitting the average air pressure across the piston head to be adjusted, 1.18 A suspension system in which the piston shafts on the struts can be engaged by a piston clutch to adjust the dynamic damping force on the strut and to lock the strut in a fixed location, 1.19 A computer controlled feedback system to adjust the average position of the piston by continuous measurement of the piston and by additionally controlling the air pressures in the regulators connected to the two ports, 1.20 A computer controlled feedback system to adjust the dynamic properties of the invention by controlling the air pressure in the supply to the struts by real time adjustments to the air pressure regulators, and by additionally controlling the air input and exhaust rates from the strut with a piezo-electric actuated valves in place of the orifices as described in 1.8, with the feedback controlled using inputs from the displacement sensors on each of the piston shafts to deduce shaft displacement, velocity and acceleration to modify the effective spring constant, damping and mass of the strut, 2. MOBILE: A pneumatic suspension method and apparatus for motion isolation of a payload from a mobile carrier, comprising of items 1.1 to 1.20, that can be fitted inside a mobile carrier and assembled, disassembled and transported between locations in standard airfreight containers.

3. MOBILE, TOWED: A pneumatic suspension method and apparatus for motion isolation of a payload as described in 2, which is installed in a towed airborne mobile carrier apart from an air compressor, the latter being hung from the tow-cable at a distance from the payload to minimize electromagnetic noise at the basket.

4. COMPOSITE: A pneumatic suspension method and apparatus for motion isolation of a payload from a carrier, comprising of items 1.1 to 1.20, in which the component accumulators, tow frame, basket are constructed of composites, the air pressure valves are controlled by piezo-electric actuators or other means to create a small electromagnetic signal, piping and ducting are constructed of non-metallic fittings and necessary metal parts are non-magnetic to minimize electromagnetic disturbances, and in which the air supply pump is removed at a distance from the basket so as to minimize electromagnetic noise at the basket.

5. MOBILE, TOWED, COMPOSITE: A pneumatic suspension method and apparatus for motion isolation of a payload as described in 3, in which the components are constructed of composites as described in 4.

6. EM, COMPOSITE: A pneumatic suspension method and apparatus for motion isolation of a payload as described in 4, where the payload comprises high precision electromagnetic sensors that require a low-noise electromagnetic environment free of stray eddy currents and electronic and mechanical noise.

7. MOBILE EM, COMPOSITE: A pneumatic suspension method and apparatus for motion isolation of a payload from a mobile carrier as described in 2, where the payload and construction are as is described in 6.

8. TOWED, MOBILE EM, COMPOSITE: A pneumatic suspension method and apparatus for motion isolation of a payload from a towed mobile carrier, as described in 3, where the payload and construction are as is described in 6.

9. TOWED, MOBILE EM, COMPOSITE, LOW, BAND: A pneumatic suspension method and apparatus for motion isolation of a payload from a towed mobile carrier, as described in 8, in which the sensors measure the electromagnetic field in the frequency band of 1 to 10,000 Hz, and in which the invention in the present disclosure provides motion isolation primarily in the 1 Hz to 50 Hz band.

10. ALL—MORE STRUTS: A pneumatic suspension method and apparatus for motion isolation of a payload as described in 1-9, in which a plurality of vertical and horizontal struts may be used as a damping and suspension means.

11. ALL—MORE ACCUMULATORS: A pneumatic suspension method and apparatus for motion isolation of a payload as described in 1-9, in which no accumulators, or a plurality of accumulators are used to augment the volume of the cylinders.

12. ALL—MORE STRUTS & ACCUMULATORS: A pneumatic suspension method and apparatus for motion isolation of a payload as described in 1-9, in which no accumulators, or a plurality of accumulators are used to augment the volume of the cylinders, and in which a plurality of vertical and horizontal struts may be used as a damping and suspension means.

13. ALL—BOTTOM STRUTS: A pneumatic suspension method and apparatus for motion isolation of a payload as described in 1-12, in which the struts support the basket and its payload from a frame located below the basket.

14. ALL—TOP & BOTTOM STRUTS: A pneumatic suspension method and apparatus for motion isolation of a payload as described in 1-12, in which the struts support the basket and its payload from a frame, both from above and from below the basket.

15. TOWED, MOBILE EM, COMPOSITE, BAND, PATENT: A pneumatic suspension method and apparatus for motion isolation of a payload from a towed mobile carrier as described in 9, and as further described in the U.S. patent Ser. No. 12/688,565 filed 2010-01-15 by Polzer et al.

16. FEEDBACK: A pneumatic suspension system as described in 1 to 15, in which force feedback transducers are employed in place of fixed orifices in the air supply and exhaust lines.

While this invention has been described in conjunction with the exemplary aspects outlined above, various alternatives, modifications, variations, improvements, and/or substantial equivalents, whether known or that are or may be presently unforeseen, may become apparent to those having at least ordinary skill in the art. Accordingly, the exemplary aspects of the invention, as set forth above, are intended to be illustrative, not limiting. Various changes may be made without departing from the spirit and scope of the invention. Therefore, the invention is intended to embrace all known or later-developed alternatives, modifications, variations, improvements, and/or substantial equivalents.

What is claimed is:

1. A vibration damping system, comprising:
a cylinder having a first coupling joint, a second coupling joint, and a piston separating an upper chamber and a lower chamber;
a first pressure regulator in communication with an air supply and the upper chamber to maintain a first pressure in the upper chamber;
a second pressure regulator in communication with the air supply and the lower chamber to maintain a second pressure in the lower chamber;

an upper accumulator capable of holding pressurized air in communication with the upper chamber;
a lower accumulator capable of holding pressurized air in communication with the lower chamber;
wherein the first coupling joint couples the cylinder to a frame, and the second coupling joint couples the cylinder to a basket connectable to a payload; and
wherein an interaction of the piston with the first pressure in the upper chamber and the second pressure in the lower chamber isolates vibrations of the frame from the basket.

2. The system of claim 1, wherein the vibrations are in a frequency range of 1 to 50 Hz.

3. The system of claim 1, wherein the vibrations are in a frequency range of 1 to 25 Hz.

4. The system of claim 1, wherein the cylinder further comprises an exhaust vent positioned toward a center of a longitudinal axis of the cylinder so as to allow air to be vented from a larger of the upper chamber and the lower chamber when the piston is displaced from an equilibrium position.

5. The system of claim 4, wherein the exhaust vent further comprise an exit orifice or a controllable valve, wherein the exit orifice is sized or the controllable valve is controlled such that a ventilation of the air is at a determined rate.

6. The system of claim 1, wherein the first pressure regulator and the second pressure regulator are controllable to provide the first pressure and the second pressure to support a determined static load and to provide a determined effective spring constant.

7. The system of claim 6, further comprising:
an upper manifold in communication with the upper pressure regulator;
an upper air supply inlet valve controlling communication between the upper manifold and the upper chamber;
a lower manifold in communication with the lower pressure regulator;
a lower air supply inlet valve controlling communication between the lower manifold and the lower chamber; and
wherein the upper manifold and the upper air supply inlet valve, and the lower manifold and the lower air supply inlet valve are configured to further provide the first pressure and the second pressure to support the determined static load and to provide the determined effective spring constant.

8. The system of claim 1, further comprising:
a piston shaft connected to the piston head and extending from the cylinder;
a clutch connected to the piston shaft and configured to damp or lock movement of the shaft.

9. The system of claim 1, wherein the upper accumulator and the lower accumulator comprise sealed containers respectively ported to the upper chamber and the lower chamber separately from the upper pressure regulator and the lower pressure regulator, respectively.

10. The system of claim 1, wherein the upper accumulator and the lower accumulator have an adjustable effective volume.

11. The system of claim 1, wherein the cylinder is configured to bear different masses of the payload by permitting a differential air pressure across the piston head to be varied.

12. The system of claim 1, further comprising a feedback system to adjust an average position of the piston by continuous measurement of the piston and by additionally controlling the air pressures provided by the upper pressure regulator and the lower pressure regulator.

13. The system of claim 1, wherein the upper accumulator, the lower accumulator, the frame, and the basket are constructed of a non-magnetic, composite material, and wherein the upper pressure regulator and the lower pressure regulator are controlled by piezo-electric actuators or other means having a relatively small electromagnetic signal.

14. The system of claim 1, wherein the cylinder, the upper pressure regulator, the lower pressure regulator, the upper accumulator, and the lower accumulator comprise one of a plurality of cylinders, upper pressure regulators, lower pressure regulators, upper accumulators, and lower accumulators configured to isolate the vibrations of the frame from the basket.

15. A pneumatic suspension apparatus for motion isolation of a payload from a carrier, comprising:
a tow frame including concentric structural members with an inner member located above an outer member, with both members connected so as to form a support truss in the shape of an inclined annular triangular lattice;
a basket suspended beneath the tow frame configured for mounting of a payload including a sensor platform or an additional second suspension system, wherein the basket is isolated from motion of the tow frame in a particular bandwidth;
a set of vertical pneumatic piston struts, having dual ports, connecting the basket to the upper, inner member of the tow frame, wherein the struts are configured to bear a majority of a static load of the basket and to isolate the basket from vertical motions of the tow frame;
a set of inclined pneumatic piston struts, having dual ports, connecting the basket to the outer member of the tow frame and configured to isolate the basket from translational and rotational motions of the tow frame; and
a set of air supply lines each connecting a respective set of a computer controlled pressure regulator and an air distribution manifold to an upper chamber or a lower chamber of each of the set of vertical struts and the set of inclined struts, wherein the air pressure in each distribution manifold is maintained at a pressure determined by the associated pressure regulator.

16. The apparatus of claim 15, wherein each of the set of supply lines includes at least one of an orifice and a computer controlled piezo-electric valve positioned between the associated manifold and the upper chamber or the lower chamber of each of the set of vertical struts and the set of inclined struts.

17. The apparatus of claim 15, further comprising:
an air supply pump to provide a source of compressed air;
an air supply pump; and
an air supply system to clean and dry the compressed air from the pump, and to feed the air via a hose to each manifold, for subsequent distribution to the pneumatic struts, such that for installations towed beneath a helicopter, the hose is mounted on the tow cable.

18. The apparatus of claim 17, wherein:
the air supply pump is mounted on a tow cable and separated from the tow frame and sensor platform by a distance of approximately 50 meters so as to isolate the payload from electrical and mechanical noise of the pump;
the air supply pump is configured to be powered from a standard helicopter power system; and
the hose of the air supply system is mounted on the tow cable.

19. The apparatus of claim 15, further comprising vents at a mid-point of each cylinder of each of the set of vertical struts and the set of inclined struts so as to allow air to be vented from a larger of the upper chamber or the lower chamber when a piston in the cylinder is displaced from an equilibrium position.

20. The apparatus of claim 19, wherein a ventilation from each vent is at a rate determined by an exit orifice size or a piezo-electric valve, wherein each vent is configured to vent the air in a manner to restore the respective strut to the equilibrium position when changes in a static load occur.

21. The apparatus of claim 15, wherein each pressure regulator controls air pressure in each distribution manifold to independently control a stiffness and a static load bearing of each strut.

22. The apparatus of claim 15, further comprising at least one of an orifice or a piezo-electric valve to control air rates from each manifolds to each strut.

23. The apparatus of claim 22, wherein each of the at least one of the orifice or the piezo-electric valve is configured to control a time required to re-center a piston in a cylinder of each strut in response to step changes in a static load.

24. The apparatus of claim 15, further comprising sensors to measure air pressure in the struts, a length of the extension of the struts, and a motion of the basket and the tow frame to provide feedback to a computer.

25. The apparatus of claim 24, further comprising data processing software in the computer that employs input from the sensors to manage the air supply to the struts through at least one of the pressure regulators and respective piezo-valves, so as to control a motion of the basket.

26. The apparatus of claim 15, further comprising low friction, self-lubricating plastic ball joints that connect an upper end of the struts to the tow frame and a lower end of the struts to the basket.

27. The apparatus of claim 15, wherein the struts are tunable to bear different payload masses by permitting a differential air pressure across a piston in a cylinder of each strut to be varied.

28. The apparatus of claim 15, wherein each strut is tunable to a different spring constants, by:
using variable volume accumulators connected to an upper and a lower chamber of a cylinder of each strut so as to change an effective volume of air within the chambers; and
permitting an average air pressure across a piston within the cylinder of each strut to be adjusted.

29. The apparatus of claim 15, wherein each strut comprises a cylinder having a piston attached to a piston shaft, and further comprising a piston clutch engaging each piston shaft, wherein each piston clutch is configured to adjust a dynamic damping force on the strut and to lock the strut in a fixed location.

30. The apparatus of claim 15, further comprising:
a computer controlled feedback system to adjust an average position of a piston of a cylinder of each strut by continuous measurement of the piston and by additionally controlling the air pressures in the regulators connected to the struts.

31. The apparatus of claim 15, further comprising:
a computer controlled feedback system to adjust dynamic properties of the apparatus by controlling the air pressure supplied to the struts by real time adjustments to the air pressure regulators, and by additionally controlling the air input and exhaust rates from each strut with a piezo-electric actuated valves, with feedback controlled using inputs from displacement sensors on a piston shaft connected to a piston within a cylinder of each strut to deduce shaft displacement, velocity and acceleration in order to modify an effective spring constant, damping and mass of each strut.

32. The apparatus of claim 15, wherein the apparatus is sized to fit inside a mobile carrier and assembled, disassembled and transported between locations in standard airfreight containers.

33. The apparatus of claim 15, wherein the apparatus is installed in a towed airborne mobile carrier, and further comprising an air compressor being hung from a tow-cable at a distance from the payload to minimize electromagnetic noise at the basket.

34. The apparatus of claim 33, wherein the apparatus is constructed of non-magnetic composite materials.

35. The apparatus of claim 15, wherein the accumulators, the tow frame, and the basket are constructed of non-magnetic composite material, the pressure regulators comprise valves controlled by piezo-electric actuators or other actuators having relatively small electromagnetic signal, and further comprising piping and ducting constructed of non-metallic fittings and wherein metal parts are non-magnetic to minimize electromagnetic disturbances, and further comprising an air supply pump removed at a distance from the basket so as to minimize electromagnetic noise at the basket.

36. The apparatus of claim 35, wherein the payload comprises high precision electromagnetic sensors that require a relatively low-noise electromagnetic environment free of stray eddy currents and electronic and mechanical noise.

37. The apparatus of claim 36, wherein the apparatus is sized to fit inside a mobile carrier and assembled, disassembled and transported between locations in standard airfreight containers.

38. The apparatus of claim 36, wherein the mobile carrier comprises a towed airborne mobile carrier, and further comprising an air compressor being hung from a tow-cable at a distance from the payload to minimize electromagnetic noise at the basket.

39. The apparatus of claim 38, further comprising sensors configured to measure an electromagnetic field in a frequency band of 1 to 10,000 Hz, and wherein the apparatus provides motion isolation primarily in a 1 Hz to 50 Hz band.

40. The apparatus of claim 15, wherein each of the set of vertical struts and the set of inclined struts comprise a damping and suspension means.

41. The apparatus of claim 15, in which no accumulators or a plurality of accumulators are used to augment a volume of a cylinder of each strut in each of the set of vertical struts and the set of inclined struts.

42. The apparatus of claim 41, wherein each of the set of vertical struts and the set of inclined struts comprise a damping and suspension means.

43. The apparatus of claim 15, wherein the struts support the basket and the payload from the tow frame located below the basket.

44. The apparatus of claim 15, wherein the struts support the basket and the payload from the tow frame, both from above and from below the basket.

45. The apparatus of claim 15, wherein the payload comprises at least one field sensor mounted to basket for collecting field data while being balanced against motion noise including vibration, pivoting and rotation from the tow frame by each of the set of vertical struts and the set of inclined struts.

46. The apparatus of claim 15, further comprising a force feedback transducer in the air supply lines.

* * * * *